United States Patent [19]
Kuo

[11] Patent Number: 5,814,381
[45] Date of Patent: Sep. 29, 1998

[54] PELLICLE ASSEMBLY HAVING A VENTED FRAME

[75] Inventor: George Nein-Jai Kuo, Los Altos, Calif.

[73] Assignee: Inko Industrial Corporation, Sunnyvale, Calif.

[21] Appl. No.: 835,106

[22] Filed: Apr. 4, 1997

[51] Int. Cl.⁶ .................................. B32B 3/02; B32B 3/30
[52] U.S. Cl. ........................... 428/14; 428/157; 428/172; 428/343
[58] Field of Search .............................. 428/14, 157, 172, 428/343; 355/30; 430/5

[56] References Cited

U.S. PATENT DOCUMENTS

| | | | |
|---|---|---|---|
| 4,697,701 | 10/1987 | Ying | 206/316 |
| 4,737,387 | 4/1988 | Yen | 428/14 |
| 4,833,051 | 5/1989 | Imamura | 430/5 |
| 5,305,878 | 4/1994 | Yen | 206/316.1 |
| 5,344,677 | 9/1994 | Hong | 428/14 |
| 5,529,819 | 6/1996 | Campi, Jr. | 428/14 |

*Primary Examiner*—Alexander Thomas
*Attorney, Agent, or Firm*—Flehr Hohbach Test, Albritton & Herbert LLP

[57] ABSTRACT

A pellicle for isolating a photomask pattern from particulate contaminants. The pellicle includes a peripheral frame having at least one vent for the passage of a gaseous substance between the interior of the frame and the atmosphere outside of the frame. The vent is configured for removal of particulate contaminants from the gaseous substance before the gaseous substance flows into the interior of the frame. The vent includes a recess formed in a first edge of the frame and at least two inlets opening into the recess, one of which couples the recess to the interior cavity of the pellicle and the other of which couples the recess to the atmosphere outside of the frame. At least one inlet is located in the first edge of the frame.

14 Claims, 3 Drawing Sheets

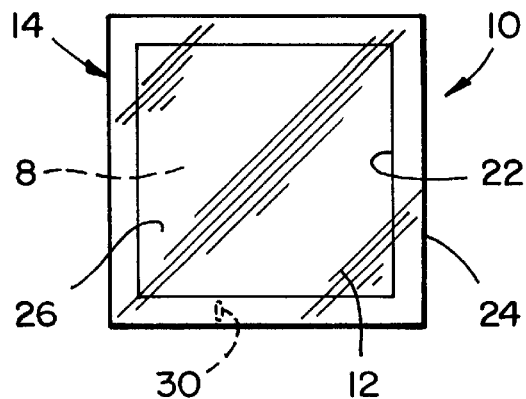
FIG_1
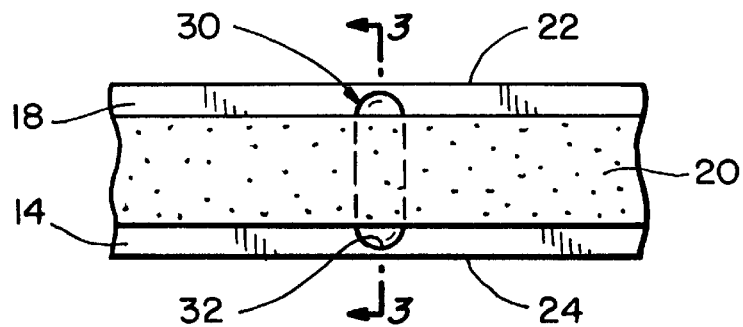
FIG_2
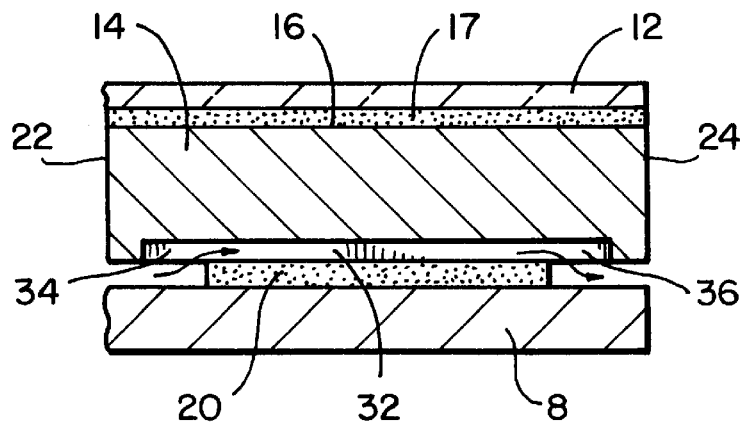
FIG_3

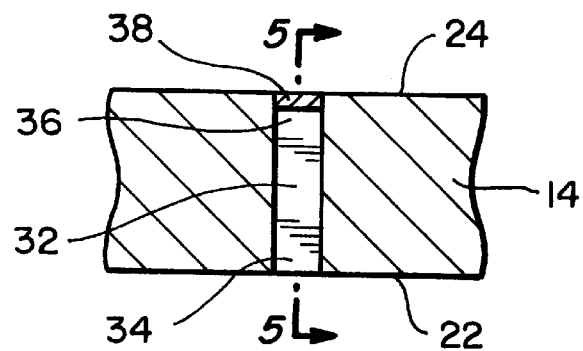
FIG_4
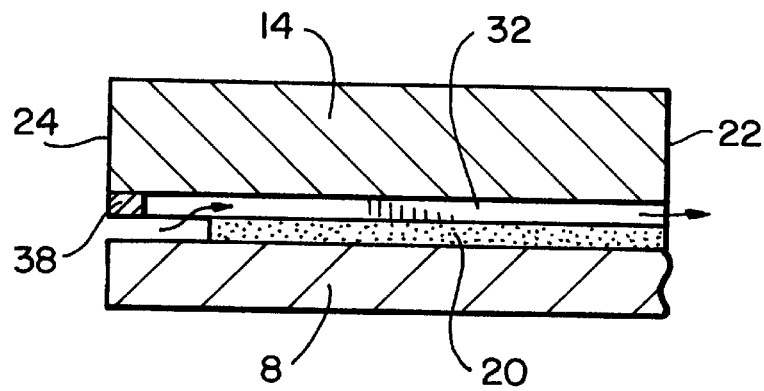
FIG_5
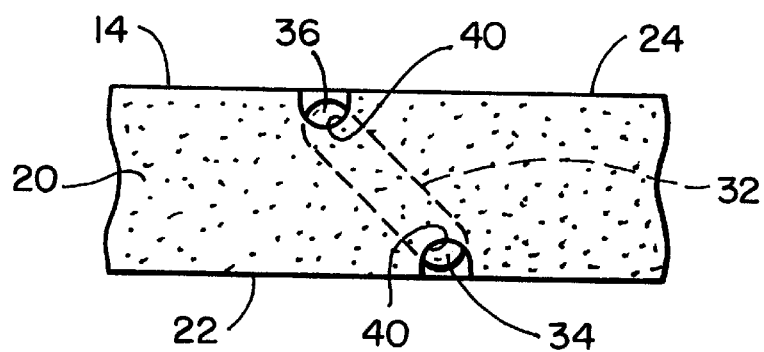
FIG_6

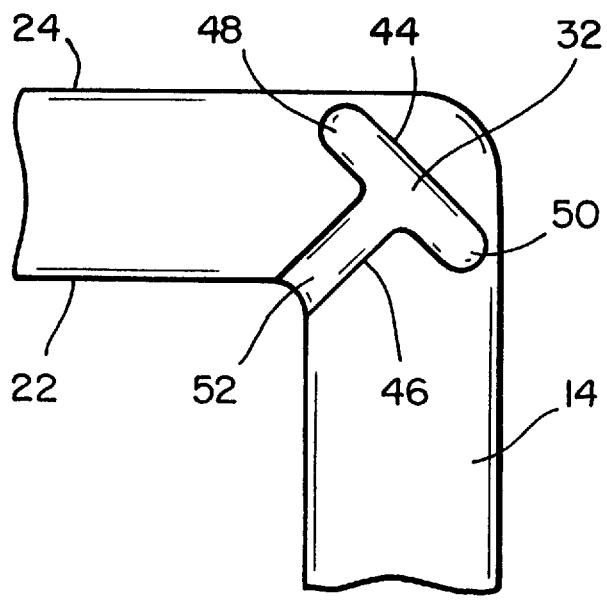
FIG_7
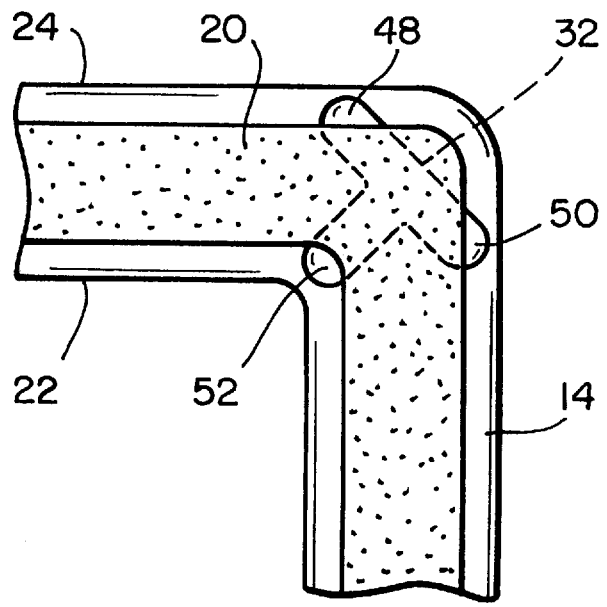
FIG_8

PELLICLE ASSEMBLY HAVING A VENTED FRAME

BRIEF DESCRIPTION OF THE INVENTION

The present invention relates in general to pellicles for protecting photomasks and reticles from particulate contamination and, more particularly, to a pellicle assembly having a vented frame.

BACKGROUND OF THE INVENTION

Photomasks, reticles and the like are typically protected from particulate contamination during fabrication by a pellicle which forms a hermetic seal around the patterns on photomask. The pellicle isolates the photomask pattern and the focal plane of the pattern from ambient dust or other foreign particles, ensuring such foreign substances are not reproduced on the semiconductor wafer during transfer of the photomask pattern to the substrate. Generally, the pellicle includes a thin protective optical membrane or film stretched across a rigid peripheral frame which may be mounted to the surface of the photomask. The pellicle film has transmissive properties which allow the passage of ultraviolet light, electromagnetic radiation and the like when the pelliclized photomask is used in the fabrication of integrated circuits. The pellicle isolates the photomask pattern from dust or other foreign matter during fabrication, and is often left on the photomask to provide continuous protection against the collection of such contaminants when the photomask is not in use.

In addition to protecting the photomask from particulate contamination, the hermetic seal between the pellicle and the photomask prevents the exchange of gases between the atmosphere and the interior cavity beneath the pellicle. When the covered photomask is subjected to changes in temperature or pressure such as when the photomask is transported to a different altitude, the difference in pressure between the interior cavity defined by the pellicle and photomask and the atmosphere outside of the pellicle may rupture or damage the protective membrane. When the pellicle membrane ruptures, the photomask may be exposed to dust and other foreign particles in the environment as well as pieces of the ruptured pellicle. A pellicle which provides for the exchange of gases between the interior cavity beneath the pellicle and the atmosphere without introducing particulate matter to the photomask pattern would allow the pressure within the interior cavity to equalize with the atmosphere, preventing rupture or damage of the pellicle membrane.

U.S. Pat. No. 4,833,051 discloses a pellicle frame with a vent in the form of a hole extending through the frame and a filter optionally covering the hole. U.S. Pat. No. 5,344,677 to Hong discloses a pellicle having a longitudinally extending channel. A first opening connects the channel with the interior of the pellicle while a second opening connects the other end of the channel with the atmosphere surrounding the pellicle. A pellicle frame having a vent structure which includes a first passageway extending between holes in the outer surface of the frame and a second passageway extending from the first passageway to the interior of the frame is disclosed in U.S. Pat. No. 5,529,819. A vent structure which provides for the exchange of gaseous substances between the interior and exterior of the pellicle while isolating the interior cavity beneath the protective film from particulate contamination is desirable. Furthermore, a pellicle with a vent structure which may be efficiently manufactured is also desirable.

OBJECTS AND SUMMARY OF THE INVENTION

It is a primary object of the present invention to provide a pellicle for protecting photomasks, reticles and the like from particulate contaminants.

It is an additional object of the present invention to provide a pellicle in which the pellicle film is protected from becoming damaged or ruptured when the pelliclized photomask is exposed to changes in temperature or pressure.

It is another object of the present invention to provide a pellicle with at least one vent providing for the exchange of gaseous substances between the atmosphere and the cavity beneath the pellicle.

It is yet another object of the present invention to provide a pellicle with a vent configured to remove particulate contaminants from the gaseous substances entering the cavity beneath the pellicle, isolating the interior cavity from the foreign matter and dust particles in the atmosphere.

It is still another object of the present invention to provide a pellicle with a vent formed in one of the edges of the pellicle frame.

A more general object of the present invention is to provide a pellicle which may be efficiently and economically manufactured, stored and applied to and removed from photomask surfaces.

In summary, the present invention provides a pellicle with a peripheral frame having an inner surface defining an interior of the frame, an outer surface, and spaced first and second edges joining the inner and outer surfaces. One of the edges is mountable to an optical membrane and the other is mountable to a selected surface such as a photomask. The pellicle includes at least one vent for the passage of a gaseous substance between the interior of the frame and the atmosphere outside of the frame. The vent is configured for removal of particulate contaminants from the gaseous substance before the gas flows into the interior of the frame. The vent includes a recess formed in a first edge of the frame and at least two inlets opening into the recess, one of which couples the recess to the interior cavity of the pellicle and the other of which couples the recess to the atmosphere outside of the frame. At least one of the inlets is located in the first edge of the frame. An adhesive layer adhered to the first edge of the frame covers a major portion of the recess, with the remainder of the recess being exposed to define at least one of the inlets opening into the recess.

Additional objects and features of the invention will be more readily apparent from the following detailed description and appended claims when taken in conjunction with the drawings.

BRIEF DESCRIPTION OF THE DRAWINGS

FIG. 1 is a top plan view of a pellicle in accordance with the invention, shown mounted to a photomask.

FIG. 2 is an enlarged plan view, partially broken away, of the pellicle assembly of FIG. 1.

FIG. 3 is an enlarged cross sectional view taken substantially along line 3—3 in FIG. 2, showing the pellicle mounted to the photomask.

FIG. 4 is an enlarged plan view, partially broken away, of a pellicle frame in accordance with another embodiment.

FIG. 5 is an enlarged cross-sectional view taken substantially along line 5—5 in FIG. 4.

FIG. 6 is an enlarged plan view, partially broken away, of a pellicle assembly in accordance with another embodiment.

FIG. 7 is an enlarged plan view, partially broken away, of a pellicle frame in accordance with another embodiment.

FIG. 8 is an enlarged plan view, partially broken away, of a pellicle assembly in accordance with another embodiment.

DETAILED DESCRIPTION OF THE INVENTION

Reference will now be made in detail to the preferred embodiment of the invention, which is illustrated in the accompanying figures. Turning now to the drawings, wherein like components are designated by like reference numerals throughout the various figures, attention is directed to FIGS. 1–3.

FIGS. 1–3 show a pellicle which is particularly suitable for isolating a surface, for example a photomask 8, from particulate contaminants including dust particles and other foreign matter. Pellicle 10 generally includes a thin, protective optical membrane 12 stretched across and secured to a peripheral frame 14. The frame 14 is mounted to the photomask 8, enclosing the photomask pattern (not shown) within the cavity inside of the optical membrane 12 and frame 14. By isolating the photomask and focal plane of the pattern from particle contaminants, the pellicle 10 ensures such foreign substances are not reproduced on the semiconductor wafer during transfer of the photomask pattern to the substrate.

The optical membrane 12 may be formed of any suitable material which is designed to pass the ultraviolet light or other electromagnetic radiation used to form the pattern of the photomask on the substrate. Suitable materials for optical membrane 12 include nitrocellulose, cellulose acetate, deep UV films, and the like. The thickness of the optical membrane is subject to considerable variation, and may be in the range of 0.6 $\mu$m to 3.0 $\mu$m. If desired, one or more layers of anti-reflective coating may be applied to the membrane 12.

Optical membrane 12 is mounted to the upper edge 16 of the peripheral frame 14. In the embodiment shown in FIGS. 1–3, the optical membrane 12 is bonded or adhered to upper edge 14 using an adhesive material 17 suitable for forming a permanent, hermetic seal between the upper edge 14 of the frame and the optical membrane. As shown particularly in FIG. 3, the lower edge 18 of the peripheral frame is mounted to the photomask 8 by an adhesive layer, generally designated 20. Adhesive layer 20 provides a temporary bond between lower edge 18 and photomask 8 so that the pellicle 10 may be easily removed from the photomask without damaging the photomask, the photomask pattern or the pellicle. Preferably, the adhesive layer 20 is permanently applied to the lower edge 18 of the frame 14, with the adhesive layer engaging the exposed surface when pellicle 10 is positioned on photomask 8 and optionally securing the frame 14 to a protective cover (not shown) when the pellicle 10 is separated from photomask 8. However, if desired the adhesive layer may be separately applied to the photomask.

Peripheral frame 14 has an inner surface 22 and an outer surface 24 joining the upper and lower edges 16 and 18. The inner and outer surfaces 22 and 24 are of sufficient height so that any dust particles or other foreign matter collecting on the outer surface of optical membrane 12 are positioned outside of the focal plane of the pattern on photomask 8 during the fabrication of semiconductor devices. In the present embodiment, frame 14 is generally rectangular in shape. However, it is to be understood that in other embodiments of the invention the frame may have a polygonal, circular or oval shape as desired. The frame 14 is preferably formed of a substantially rigid material, such as aluminum.

When pellicle 10 is mounted to the photomask, the photomask pattern is enclosed within an interior cavity 26 defined by the optical membrane 12, inner surface 22, and photomask 8. The interior cavity 26 surrounds the photomask pattern in an environment which is substantially free of dust, foreign matter and other particulate contaminants. The air-tight seal between the membrane 12 and upper edge 16 of the frame substantially prevents gaseous substances from seeping around the peripheral frame 14 and carrying particulate contaminants into the interior cavity 26. Similarly, the bond between the lower edge 18 and the adhesive layer 20 generally prevents gaseous substances from seeping into the cavity. However, it is to be understood that the interior cavity is not air-tight. Instead, the pellicle 10 includes at least one vent 30 (FIGS. 2 and 3) which permits a limited gas exchange between the interior cavity 26 and the exterior of the frame.

Turning to FIGS. 2 and 3, the vent 30 will be described in greater detail. Vent 30 generally includes a recess 32 formed in the lower edge 17. As is shown particularly in FIG. 2, in this embodiment the opposed ends 34 and 36 of the recess 32 are positioned inwardly of the inner and outer surfaces 22 and 24, respectively. The recess 32 therefore does not extend across the entire width of the frame 14 or intersect the inner and outer surfaces 22 and 24. A major portion of the recess 32 is covered by the adhesive layer 20 to form a passageway for gaseous substances. The remainder of the recess 32, in this modification the inner and outer ends 34 and 36, is not covered by adhesive to define inlets or openings through which gaseous substances may enter the recess passageway. These inlets or openings are located in the lower edge of the frame 14. As is shown particularly in FIG. 3, gaseous substances may travel between the interior cavity 26 and the exterior of the pellicle assembly by flowing between the frame 14 and the surface of the substrate, moving upwardly into the recess through the exposed end, flowing through the recess passageway, moving downwardly through the opposite exposed end, and flowing between the frame and the substrate surface. The vent 30 provides a filter, with the configuration of the vent 30 and the adhesive layer 30 trapping particles and other contaminants which may be carried by the gaseous substances. Minimizing or even eliminating the particulate contamination within the interior cavity 26 is of particular advantage in that it reduces the risk of the formation of defects in the products manufactured using the photomask 8.

Allowing gaseous substances to flow between the cavity 26 and the surrounding environment protects the pellicle 10 against a change in pressure which may damage or rupture optical membrane 12. If the pressure of interior cavity 26 becomes lower than that of the surrounding atmosphere because of changes in atmosphere, elevation, etc., air or another gaseous substance flows through the vent 30 and into the cavity 26 to equalize the pressure of the cavity and the atmosphere. As the gaseous substance passes through the vent, the particulate contaminants carried by the gaseous substance are trapped in the recess as well as the gaps between the frame 14 and the photomask substrate. The sticky or tacky surface of the adhesive layer 20 also catches some of the particulate matter carried by the gaseous substance. Preferably, the vent structure 30 prevents dust or other foreign particles having a size of approximately 1 microns or greater from entering the interior cavity 26 between the pellicle 10 and the photomask.

When the pellicle 10 and photomask 8 are heated or moved to a higher elevation, increasing the pressure of the interior cavity 26 relative to the surrounding atmosphere, a portion of the gaseous substance within the interior cavity may escape through the vent 30, relieving the pressure within interior cavity 26 before optical membrane 12 ruptures or becomes damaged. As the gaseous substance is expelled from the cavity 26, some of the particles trapped within the vent 30 may be carried along the vent 30 toward the outer surface of the frame with some even being removed from the vent 30.

The recess 32 is preferably formed in the lower edge 18 of the frame. However, it is to be understood that forming the recess in the upper edge 16 of the frame is within the scope of this invention. In the embodiment shown in FIGS. 2 and 3, the recess 32 is provided by a groove which is substantially perpendicular to the inner surface 22 and outer surface 24. The recess 30 preferably has a width within the range of 0.005 inches ±0.002 inches and a depth in the range of 0.005 inches ±0.002 inches; although it is to be understood that these values are subject to considerable variation. The width, depth and cross-sectional shape of recess 32 may also be varied within the scope of this invention.

The configuration of the adhesive layer 20 is also subject to considerable variation. In the embodiment of FIGS. 2 and 3, the width of adhesive layer 20 is less than the width of the frame, leaving the opposed ends 34 and 36 of the recess 32 exposed. The adhesive layer may be of uniform width along the entire circumference of the frame or, if desired, only a portion of the adhesive layer may be of a lesser width than the frame. Alternatively, the adhesive layer 20 may be provided with cut-outs or other openings which expose the ends of the recess 32. The openings may be formed in the layer 20 before it is applied to the frame or holes may be formed by punching, cutting or other suitable means after the adhesive layer has been applied.

In the embodiment of FIGS. 2 and 3, the groove as formed terminates inwardly of the inner and outer surfaces of the frame. FIGS. 4 and 5 show a modification of the invention in which the groove extends across the entire width of the frame 14, breaking through the inner and outer surfaces 22 and 24. A plug 38 is disposed in the recess 32 to seal the hole formed in the outer surface 24. In this embodiment, the hole formed in the inner surface 22 is left open, although if desired this hole may be sealed by a second plug (not shown). Alternatively, the hole in the inner surface 22 may be plugged and the opening in the outer surface 24 left open.

As gaseous substances travel from the atmosphere to the interior cavity 26, the gases flow between the lower edge 18 of the frame and the surface of the photomask substrate, upwardly through the exposed opening at the outer end 36 and into the recess 32. The gases flow along the recess 32, through the hole formed in the inner surface 22 and into the interior cavity 26. This path is reversed for gaseous substances traveling from the interior cavity to the atmosphere outside of the pellicle.

Another modification of this invention is shown in FIG. 6. Pellicle frame 14 is formed with a recess 32 which is oriented at an angle relative to a line perpendicular to the inner and outer surfaces 22 and 24. The adhesive layer 20 is of substantially the same width as the frame 14. Two openings 40 are formed in the adhesive layer 20 proximate the inner and outer ends 34 and 36 to provide access to the recess 32. Gaseous substances travel through the openings 40 in the adhesive layer 20 to enter the recess. As discussed above, the openings 40 may be formed before or after application of the layer 20 to the frame by cutting, punching, or other suitable means.

In the previously described embodiments, the recess 32 has a substantially linear configuration. However, the recess 32 may also have other shapes. FIGS. 7 and 8 illustrate embodiments of this invention in which a T-shaped recess is formed in a corner of the frame 14. The recess 32 includes a first leg 44 extending between adjoining sides of the outer surface 24 and a second leg 46 extending from the first leg 46 to the inner surface 22. In the modification shown in FIG. 7, the ends 48 and 50 of the first leg 44 are positioned inwardly of the outer surface 24 and the second leg 46 terminates in a hole formed in the inner surface 22. As discussed above, the groove forming the recess may terminate inwardly of the outer surface 24 or the groove may cut through the surface with the holes formed therein being substantially sealed by plugs. Gaseous substances enter the recess 32 from the atmosphere outside of the pellicle by flowing between the lower edge 18 of the frame 14 and the pellicle surface, upwardly into either end 48 or 50, along the first leg 44 and second leg 46, and through the opening in the inner surface into the interior cavity 26. FIG. 8 is similar to FIG. 7 except that the inner end 52 of the second leg 46 of the recess is spaced inwardly of the inner surface 26 or closed with a plug (not shown). Gaseous substances must flow downwardly through an opening at the end 52 of the second leg 46 and between the lower edge 18 of the frame and the photomask surface to reach the interior cavity 26. In the modification shown in FIG. 8, the width of the adhesive layer 20 is less than the width of the frame to expose the ends 48, 50 and 52 of the first and second legs of the recess 32. However, it is to be understood that the holes, cut-outs or other openings may be formed in the adhesive layer 20 to provide access to the recess 32.

With the vent of the present invention, pellicle 10 may be subjected to changes in temperature and pressure without rupturing the optical membrane or damaging the pellicle or photomask. While gaseous substances may travel between the interior cavity 26 and the exterior of the pellicle, the vent removes particulate contaminants from the gaseous substances passing through the channels. Thus, the interior cavity between the pellicle and the photomask remains substantially free of dust matter and other foreign particles.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A pellicle assembly comprising:

a peripheral frame having an inner surface defining an interior of said frame, an outer surface, and spaced first and second edges joining said inner and outer surfaces, one of said edges being mountable to an optical membrane and the other of said edges being mountable to said selected surface;

at least one vent for providing a passageway for a gaseous substance between said interior of said frame and the atmosphere outside of said frame, said vent including a recess formed in said first edge of said frame and at least two inlets opening into said recess, one of said inlets coupling said recess to said interior of said frame and the other of said inlets coupling said recess to the atmosphere outside of said frame, at least one of said inlets being located in said first edge of said frame.

2. The pellicle assembly of claim 1 in which both of said inlets are located in said first edge of said frame inwardly of said inner and outer surfaces.

3. The pellicle assembly of claim 1 in which said recess is defined by at least one groove formed in said first edge of said frame.

4. The pellicle assembly of claim 3 in which said groove terminates in an inner opening formed in said inner surface and an outer opening formed in said outer surface, and at least one plug closing one of said inner opening and said outer opening.

5. The pellicle assembly of claim 1 in which said recess has a substantially perpendicular orientation relative to said inner surface and said outer surface.

6. The pellicle assembly of claim 1 in which said recess has a T-shaped configuration.

7. The pellicle assembly of claim 1 in which said vent includes two inlets coupling said recess to the atmosphere outside of said frame.

8. The pellicle assembly of claim 1, and further comprising an adhesive layer adhered to said first edge of said frame, a portion of said recess being covered by said adhesive layer to define an enclosed passageway for the flow of said gaseous substance and the remainder of said recess being exposed to define said at least one of said inlets.

9. The pellicle assembly of claim 1, and further comprising an optical membrane mounted to said second edge of said frame.

10. A pellicle assembly comprising:
a peripheral frame having an inner surface defining an interior of said frame, an outer surface, and spaced first and second edges joining said inner and outer surfaces, one of said edges being mountable to an optical membrane and the other of said edges being mountable to said selected surface;
an adhesive layer adhered to said first edge of said frame;
at least one vent for providing a passageway for a gaseous substance between said interior of said frame and the atmosphere outside of said frame, said vent including a recess formed in said first edge of said frame, said recess having at least one inner inlet and at least one outer inlet, a portion of said recess being covered by said adhesive layer and a portion of said recess being exposed to define said outer inlet opening into said recess, said outer inlet opening being positioned inwardly of said outer surface of said frame.

11. The pellicle assembly of claim 10 in which said recess and said adhesive layer are configured to define said inner inlet, said inner inlet being positioned inwardly of said inner surface of said frame.

12. The pellicle assembly of claim 10 in which said first edge has a first width between said inner surface and said outer surface and said adhesive layer has a second width less than said first width.

13. The pellicle assembly of claim 10 in which said adhesive layer has at least one opening formed therein, said opening exposing a portion of said recess to define said outer inlet.

14. The pellicle assembly of claim 10 in which said adhesive layer is mountable to said selected surface, and further comprising an optical membrane mounted to said second surface.

* * * * *